(12) United States Patent
Kim et al.

(10) Patent No.: US 10,459,167 B2
(45) Date of Patent: Oct. 29, 2019

(54) OPTICAL FIBER CAPABLE OF CONVERTING WAVELENGTH AND BACKLIGHT UNIT USING THE SAME

(71) Applicant: LG Display Co., Ltd., Seoul (KR)

(72) Inventors: Wonrae Kim, Paju-si (KR); Seungbum Lee, Gimpo-si (KR); Sooin Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/108,228

(22) Filed: Aug. 22, 2018

(65) Prior Publication Data

US 2019/0162905 A1   May 30, 2019

(30) Foreign Application Priority Data

Nov. 24, 2017 (KR) ........................ 10-2017-0158212

(51) Int. Cl.
  *G02B 6/293* (2006.01)
  *G02B 6/02* (2006.01)
  *H01L 33/50* (2010.01)

(52) U.S. Cl.
  CPC ........... *G02B 6/29317* (2013.01); *G02B 6/02* (2013.01); *H01L 33/502* (2013.01)

(58) Field of Classification Search
  CPC ...... G02B 6/29317; G02B 6/02; H01L 33/502
  See application file for complete search history.

(56) References Cited

U.S. PATENT DOCUMENTS

| | | | | |
|---|---|---|---|---|
| 7,679,101 B2* | 3/2010 | Ota | ........................ | B82Y 20/00 257/100 |
| 7,943,941 B2* | 5/2011 | Shimizu | ............. | C09K 11/7767 257/103 |
| 8,044,572 B2* | 10/2011 | Sakata | .................. | C04B 35/117 313/467 |
| 8,263,001 B2* | 9/2012 | Cho | .................... | G01N 21/6428 250/458.1 |
| 8,921,280 B2* | 12/2014 | Cho | .................... | G01N 21/6454 506/17 |
| 9,181,476 B2* | 11/2015 | Izawa | ................. | C09K 11/7741 |
| 10,047,931 B2* | 8/2018 | Izawa | ................. | C09K 11/7741 |
| 10,088,114 B2* | 10/2018 | Lunz | ......................... | F21K 9/64 |
| 2010/0110728 A1* | 5/2010 | Dubrow | ............... | C09K 11/025 362/615 |
| 2010/0111762 A1* | 5/2010 | Cho | .................... | G01N 21/6428 422/52 |
| 2010/0204064 A1* | 8/2010 | Cho | .................... | G01N 21/6454 506/17 |
| 2011/0273864 A1* | 11/2011 | Izawa | ................ | C09K 11/7741 362/84 |
| 2014/0242264 A1* | 8/2014 | Stenhauser | ............. | C23C 18/40 427/99.5 |

(Continued)

*Primary Examiner* — Andrew Jordan
(74) *Attorney, Agent, or Firm* — Polsinelli PC

(57) ABSTRACT

The present disclosure relates to an optical fiber capable of converting a wavelength of a light emitted from a light source and a backlight unit using the same.

According to the present disclosure, it is possible to extract a light of a desired wavelength band or a desired color (for example, a white light) by connecting an optical fiber, to which a color conversion material is applied, to a single laser light emitting element that emits a light of a specific wavelength band.

21 Claims, 13 Drawing Sheets

(56) References Cited

U.S. PATENT DOCUMENTS

| | | | |
|---|---|---|---|
| 2015/0036377 A1* | 2/2015 | Tininenko | H04N 13/363 |
| | | | 362/231 |
| 2016/0061418 A1* | 3/2016 | Izawa | C09K 11/7741 |
| | | | 362/97.1 |
| 2016/0365702 A1* | 12/2016 | Bower | H01S 5/041 |
| 2018/0041005 A1* | 2/2018 | Bower | H01S 5/041 |
| 2018/0120492 A1* | 5/2018 | Lee | G02B 6/005 |
| 2019/0162905 A1* | 5/2019 | Kim | G02B 6/29317 |

* cited by examiner

OPTICAL FIBER CAPABLE OF CONVERTING WAVELENGTH AND BACKLIGHT UNIT USING THE SAME

CROSS-REFERENCE TO RELATED APPLICATION

This application claims priority to and the benefit of Korean Patent Application No, 10-2017-0158212, filed on Nov. 24, 2017, the disclosure of which is incorporated herein by reference in its entirely.

BACKGROUND

Field of the Disclosure

The present disclosure relates to an optical fiber capable of converting a wavelength of light emitted from a light source and a backlight unit using the same.

Description of the Background

Recently, a flat panel display devices having excellent properties such as a thin profile, a light weight, and low power consumption have been widely developed and applied to various fields.

As a typical flat panel display device, a liquid crystal display device has a large contrast ratio, and is suitable for a moving picture display, and has low power consumption, and thus, it has been utilized in various fields such as a notebook, a monitor, and a TV.

A liquid crystal has an optical anisotropy, which has a thin and long molecular structure, and has a directionality in arrangement, and a polarization property in which a direction of a molecular arrangement is changed according to the size thereof when it is placed in an electric field, and a liquid crystal display device realizes an image by using the optical anisotropy and the polarization property of the liquid crystal.

In general, the liquid crystal display device includes a display panel in which a liquid crystal layer is interposed between a first substrate (for example, a color filter substrate) and a second substrate (for example, an array substrate) and attached.

FIG. 1 is an exploded perspective view of a display panel used in a conventional liquid crystal display device.

Referring to FIG. 1, a display device includes a display panel 10 including a first substrate 11 and a second substrate 12 having a liquid crystal layer interposed therebetween, and covers an edge of a front surface of a DP (display panel).

A backlight unit 20 including a guide panel 21, a diffuser plate or an optical film 22 and a rear side cover 23 is disposed on a rear surface of the DP (display device) together with a diffuser plate or an optical film 40.

The backlight unit 20 is disposed in a lower portion of the DP (display panel) and serves to provide a light to the DP and uses a laser light emitting element 24 as a light source. The light emitted from the laser light emitting element 24 can be guided by an optical fiber 25 and emitted in a desired direction.

A laser light emitting element used as a light source generally serves as a source for providing a light of a single wavelength band. Therefore, in order to obtain a light of a desired wavelength band or desired color (for example, a white light), there exists a difficulty that has to connect a plurality of laser light emitting elements that emits a light of a different wavelength band from each other to the optical fiber, or arrange a plurality of optical fibers connected to a plurality of laser light emitting elements that emit the light of the different wavelength band from each other, respectively.

On the other hand, even if the laser light emitting element that provides the light of the single wavelength band is used, a method of arranging a film having a color conversion function or a filter to the optical film 22, 40 to obtain the light of the desired wavelength or the desired color (for example, the white light) has been proposed. Even if the wavelength band of the light provided from the light source through the optical film is changed, an additional problem may be generated that has to improve a light extraction efficiency since a loss of the emitted light is generated.

SUMMARY

The present disclosure has been made to solve the above-mentioned problems, and it is an object of the present disclosure to provide an optical fiber that connects a plurality of laser light emitting elements that emit a light of a different wavelength band from each other to an optical fiber in order to obtain a light of a desired wavelength band or a desired color (for example, a white light), or capable of obtaining a light of a desired wavelength band or a desired color (for example, a white color) without the need to arrange a plurality of optical fibers connected to the plurality of laser light emitting elements that emit the light in the different wavelength band from each other, respectively, and a backlight unit using the same.

The present disclosure also provides an optical fiber using a light source that provides a light of a single wavelength band and capable of obtaining the light of the desired wavelength band or the desired color (for example, the white light) without using a separate optical film, and a backlight using the same.

In particular, an object of the present disclosure is to provide an optical fiber that uses a laser light emitting element that provides a high efficiency of a blue light, and includes a material that converts a blue light emitted from the laser light emitting element to a light of a different wavelength band, and guides a light emitted from the laser light emitting element in order to realize a light other than the blue light (for example, a white light) consequently and a backlight unit using the same.

In accordance with an aspect of the present disclosure, there is provided a core portion and a cladding portion that covers an outer peripheral surface of the core portion, and the cladding portion is arranged with a plurality of openings in a form extending from an inside toward an outside along an extending direction of the core portion.

At this time, the opening may include a first crevice with which a color conversion material is filled and a second crevice with which a color conversion material is not filled, so that a light emitted through the first crevice can be different from a light emitted through the second crevice.

In addition, the first crevice and the second crevice are arranged adjacent to each other so that the light emitted through the first crevice and the light emitted through the second crevice can be mixed with each other, and as a result, it is possible to provide the optical fiber that consequently emits the light of the different wavelength band from the light provided in the core portion through the plurality of openings.

In accordance with another aspect of the present disclosure, there is provided the optical fiber including the core portion that includes the color conversion material and a cladding portion that covers the outer peripheral surface of the core portion and the plurality of openings in a form extending from the inside toward the outside along the extending direction of the core portion.

Accordingly, the light provided to the core portion is absorbed by the color conversion material in the core portion and then emitted as the light of the other wavelength band. As a result, it is possible to provide the optical fiber that emits the light of the different wavelength band different from that of the light provided to the core portion through the plurality of openings.

In addition, the core portion may include the first core with which the color conversion material is filled and the second core with which the color conversion material is not filled so that the wavelength of the light emitted through the first crevice that exposes the first core can be different from that of the light emitted through the second crevice that exposes the second core.

Further, the first crevice and the second crevice may expose the first core and the second core in a direction in which the first crevice and the second crevice are directed to each other, so that the light emitted through the first crevice and the light emitted through the second crevice can be mixed with each other, and consequently, it is possible to provide an optical fiber that emits the light of a wavelength band different from the wavelength band of the light provided to the core portion through a plurality of openings.

According to another aspect of the present disclosure, there is provided the backlight unit using the above-mentioned optical fiber.

According to the present disclosure, instead of connecting a plurality of laser light emitting elements emitting the light of the different wavelength band from each other to an optical fiber in order to obtain the light of the desired wavelength band or the desired color (for example, the white light), it is possible to obtain the light of the desired wavelength or the desired color (for example, the white color) by connecting the optic fiber, to which the color conversion material is applied, to the single laser light emitting element that emits the light of the certain wavelength band.

Further, according to the present disclosure, instead of using the plurality of optical fibers respectively connected to the plurality of laser emitting elements emitting the light of the different wavelength band from each other to obtain the light of the desired wavelength band or the desired color (for example, the white light), it is possible to obtain the light of the desired wavelength band or the desired color (for example, the white light) by connecting the optical fiber, to which the color conversion material is applied, to the single laser light emitting element that emits the light of the specific wavelength band.

Further, according to the present disclosure, there is no need to provide the separate optical film for changing the wavelength band of the light emitted from the laser light emitting element, so that a problem of an extraction efficiency of the light emitted from the optical fiber by the optical film is reduced can be solved In addition, in a device using an optical fiber such as a backlight unit, since it is possible to obtain the light of a desired wavelength band or a desired color (for example, a white light) without a separate optical film for changing the wavelength band of light emitted from the laser light emitting element, a device having a simpler configuration can be formed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Hereinafter, an optical fiber according to various aspects of the present disclosure and a backlight unit using the same will be described in detail.

Figure 1:
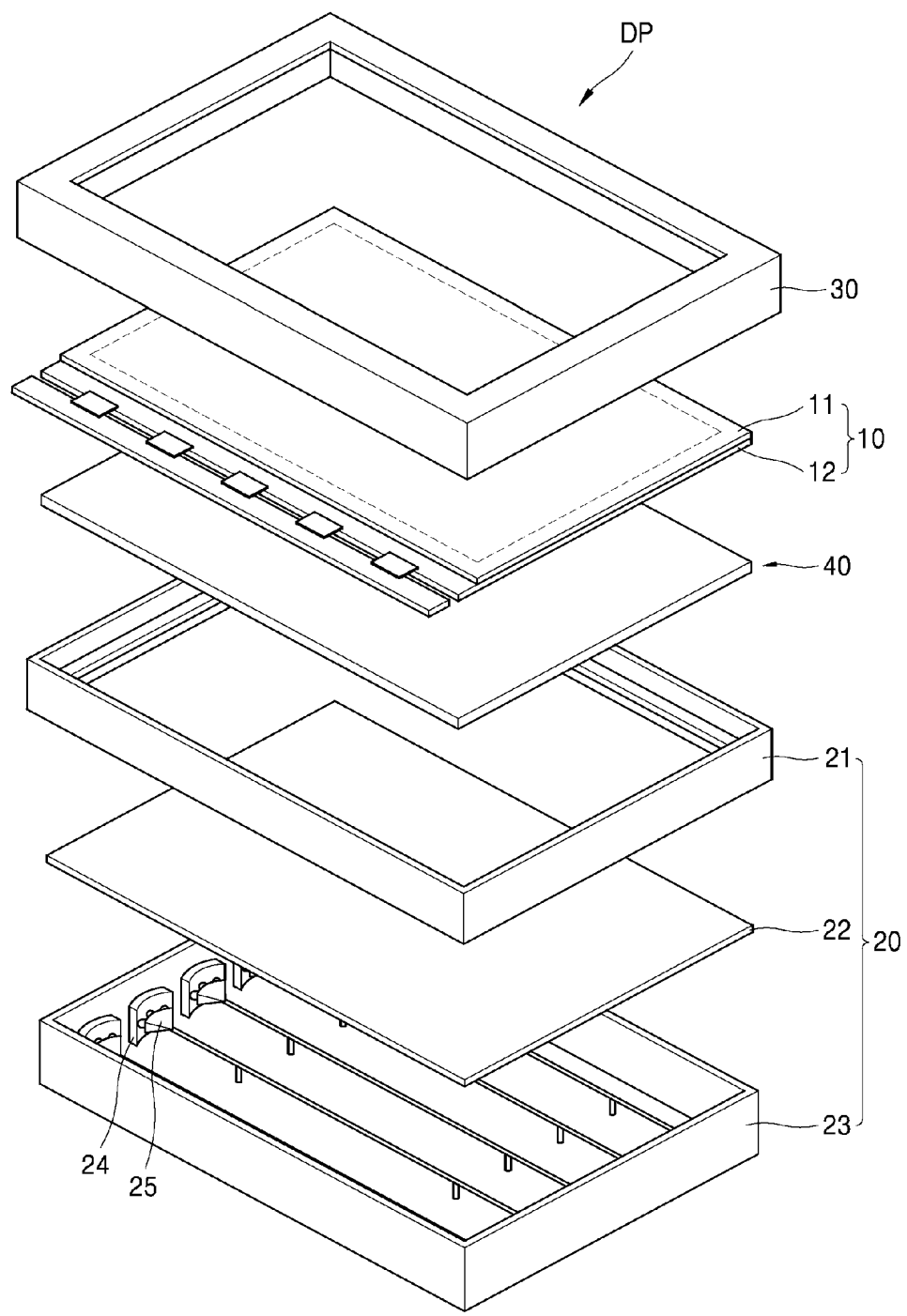
FIG. 1 is an exploded perspective view of a display panel used in a conventional liquid crystal display device.
Figure 2:
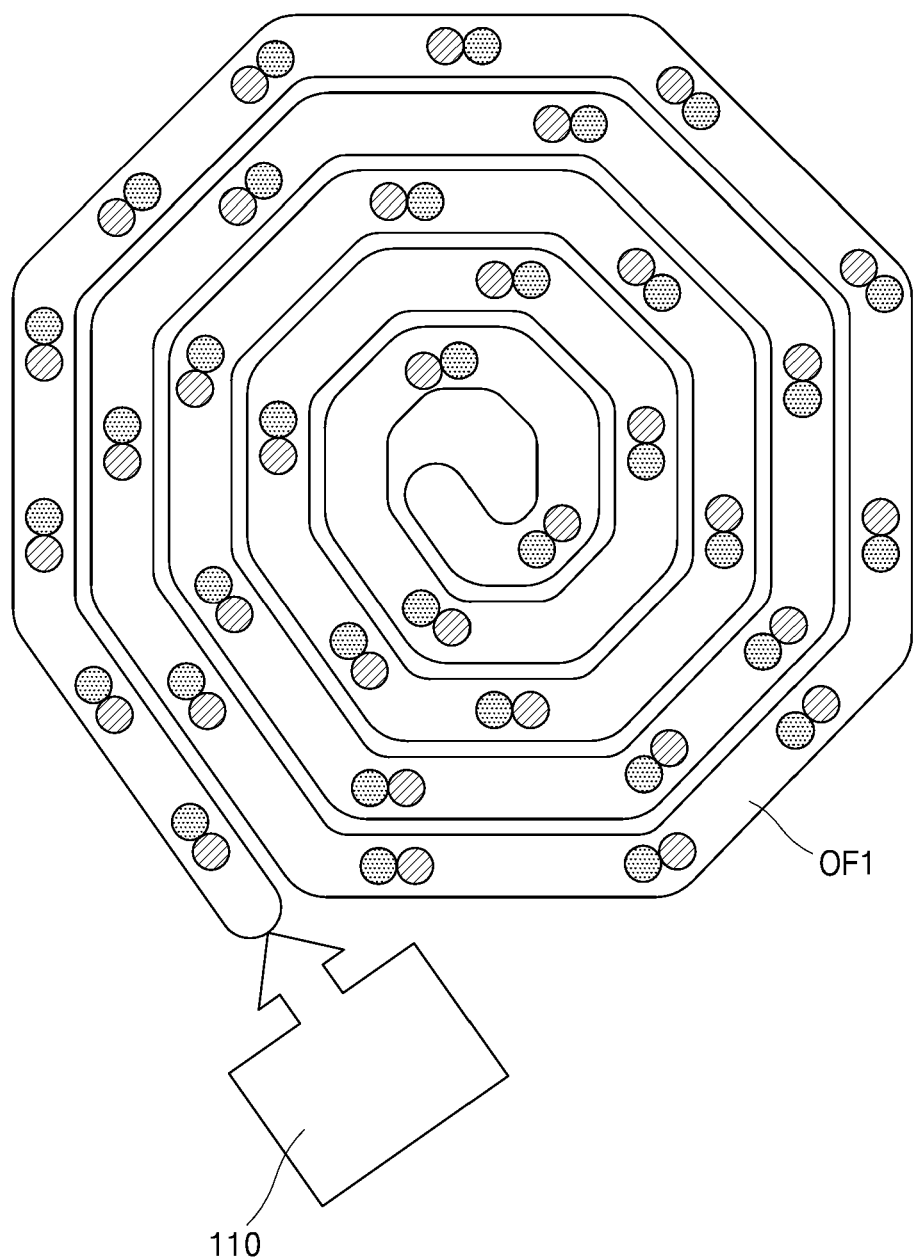
FIG. 2 schematically shows a configuration of a backlight unit in accordance with an aspect of the present disclosure.

FIG. 2 schematically shows a configuration of a backlight unit 100 in accordance with an aspect of the present disclosure.

Referring to FIG. 2, the backlight unit 100 in accordance with an aspect of the present disclosure includes a light source 110 that emits a light of a single wavelength, an optical fiber OF1 that converts a wavelength of a light emitted from the light source 110 and emits it.

Here, the light source 110 is a light source in a form of a linear light source that emits a light to the optical fiber OF1, and a laser light emitting element, a light emitting device array, a cold cathode fluorescent lamp, or an external electrode fluorescent lamp, etc., can be used.

In particular, the light source 110 may be a highly efficient laser light emitting element as a light source that emits a light of a single wavelength is used.

It is to be understood that the optical fiber OF1 used in the backlight unit 100 shown in FIG. 2 can be suitably used not only as a use of a light source for a display device but also as various uses (for example, a lighting, a light generating or transmitting device, etc.) by changing an appearance or an arrangement structure of the optical fiber OF1 as necessary.

Figure 3:
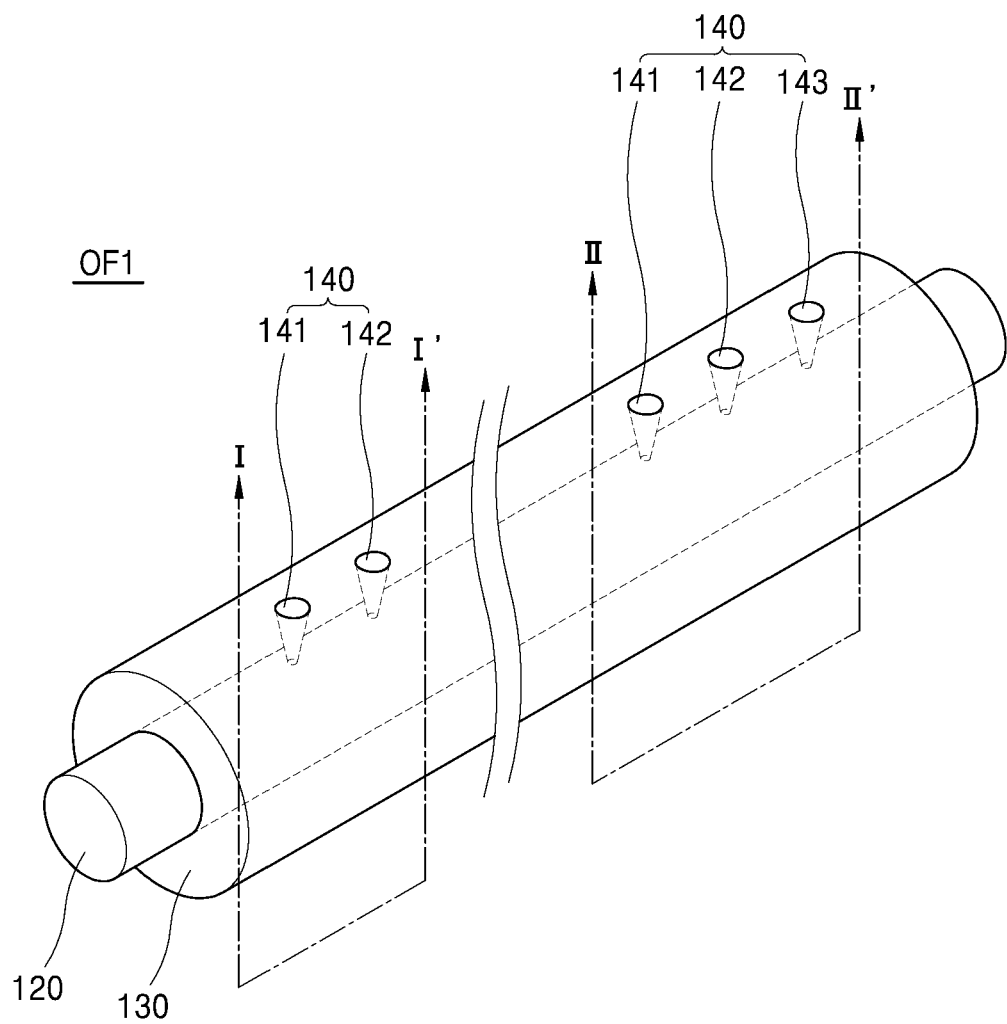
FIG. 3 is a perspective view of the optical fiber used in FIG. 2.

Referring to FIG. 3 showing a perspective view of the optical fiber used in FIG. 2, an optical fiber OF1 in accordance with an aspect of the present disclosure includes a core portion 120 and a cladding portion 130 that covers an outer peripheral surface of the core portion 120. In addition, a plurality of openings 140 is disposed in the cladding portion 130 along an extending direction of the core portion 120. Here, a first crevice 141 and a second crevice 142 in the opening 140 may be disposed along the extending direction of the core portion 120 in the same manner as the opening 140. Here, a crevice means a gap or a groove provided in the cladding portion 130 so that a light proceeding through the core portion 120 can be emitted to an outside of the cladding portion 130.

For reference, FIG. 3 is a perspective view showing a part of an area of the optical fiber OF1 in accordance with an aspect of the present disclosure. For convenience, the necessary number of the opening 140 is only shown for the explanation of the opening 140.

The core portion 120 may be formed of a light transmitting material such as glass or plastic so that light emitted from a light source can proceed, and the cladding portion 130 may be also formed of plastic.

Here, the cladding portion 130 is formed of a material having a refractive index higher than that of the core portion 120 so that the light proceeding through the core portion 120 is not emitted to the outside of the cladding portion 130 through a total internal reflection and is proceeded in the core portion 120. In this case, when the light proceeded in the core portion 120 reaches the plurality of openings 140 arranged at the cladding portion 130, it can be emitted to the outside through the plurality of openings 140 since it does not meet a condition of the total internal reflection.

In addition, in another example, the cladding portion 130 may be formed of a light-impermeable material such that the light proceeding through the core portion 120 is not substantially emitted to the outside of the cladding portion 130. In this case, when the light proceeding in the core portion 120 reaches a plurality of openings 140 to expose the core portion 120, it can be emitted to the outside.

Figure 4:
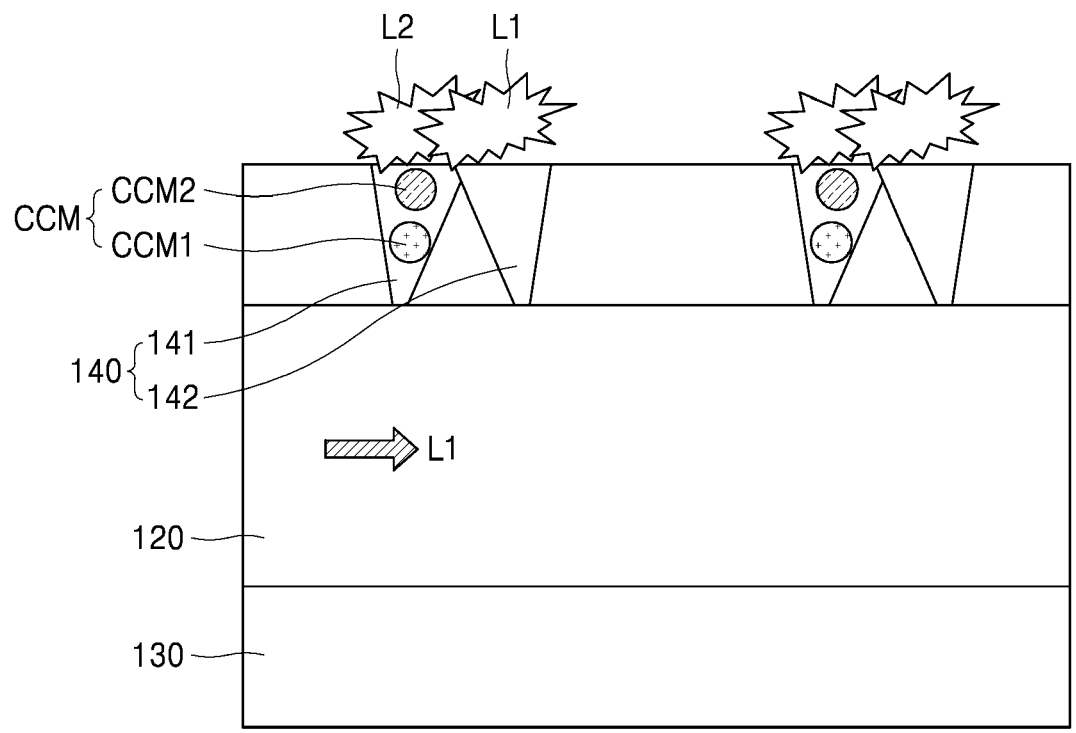
FIG. 4 is a cross-sectional view taken along section line I-I' of FIG. 3.

FIG. 4 is a cross-sectional view taken along section line I-I' of FIG. 3.

Referring to FIG. 4, a cladding portion 130 is arranged with an opening 140 along an extending direction of a core portion 120 and the opening 140 may have a shape extending from an inside (a portion to which the core portion is contact) toward an outside (an outermost of the cladding) in order to improve a diffusion efficiency of the light.

Here, the opening 140 includes a first crevice 141 with which a CCM (color conversion material) is filled and a second crevice 142 with which a CCM (color conversion material) is not filled. A wavelength band of a light L2 emitted through the first crevice 141 can be different from that of a light L1 emitted through the second crevice 142 depending on the presence or absence of the color conversion material.

A CCM (color conversion material) filled in the first crevice 141 is a material that absorbs a light of a specific wavelength band and emits a light of a different wavelength band. Generally, it is a generic term for a material that absorbs a short wavelength band light and emits a long wavelength band light.

For example, when a light emitted from a light source connected to the optical fiber (OF1) has a blue wavelength band, a material that absorbs a blue light and emits a red light or a green light may be used as a CCM (color conversion material).

In the above aspect, the first crevice 141 may be simultaneously filled with a material CCM1 that absorbs the blue light and emits the red light, and a material CCM2 that absorbs the blue light and emits the green light.

Therefore, the light (L1, for example, the blue light) proceeding through the core portion 120 can be emitted as a yellow light L2 through the first crevice 141 and emitted as a blue light L1 through the second crevice 142.

In addition, the first crevice 141 and the second crevice 142 are arranged adjacent to each other such that the light L2 emitted through the first crevice 141 and the light L1 emitted through the second crevice 142 can be mixed with each other.

Accordingly, it is possible to provide an optical fiber that emits a light of a different wavelength band or a different color from the wavelength band of the light L1 proceeding through the core portion 120.

For example, when the light L1 proceeding through the core portion 120 is the blue light, as the yellow light L2 is emitted through the first crevice 141 and the blue light L1 is emitted through the second crevice 142, and the first crevice 141 and the second crevice 142 are arranged adjacent to each other, the yellow light L2 and the blue light L1 can be mixed with each other to show a white light finally.

As described above, although the first crevice 141 and the second crevice 142 are arranged so as to overlap each other at an outermost side of the cladding portion 130 in order to mix the light emitted through the first crevice 141 and the second crevice 142 (see FIG. 4), it can be arranged so as not to overlap with each other (that is, spaced apart) within a range in which the mixing of the light is possible.

Figure 5:
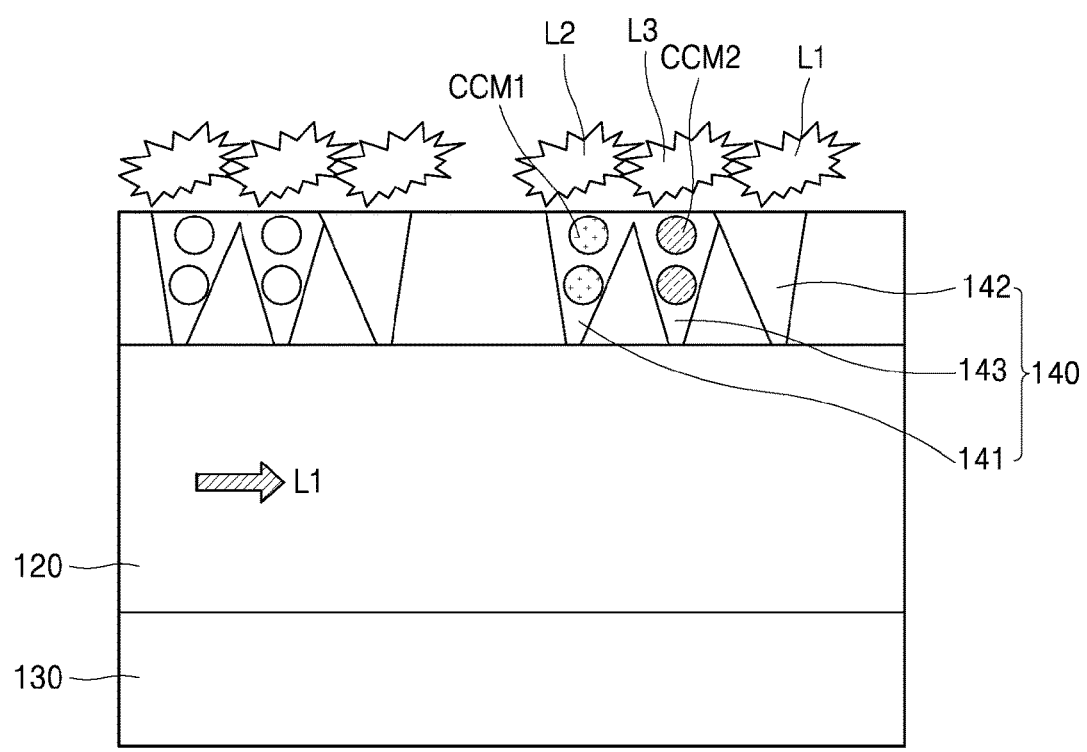
FIG. 5 is a cross-sectional view taken along cutting line II-II' of FIG. 3.

FIG. 5 is a cross-sectional view taken along cutting line II-II' of FIG. 3.

Referring to FIG. 5, an opening 140 includes a first crevice 141 with which a CCM1 (first color conversion material) is filled, a second crevice 142 with which a CCM (color conversion material) is not filled, and a third crevice 143 in which a CCM2 (second color conversion material) is filled. The wavelengths of a light L2 emitted through the first crevice 141, a light L1 emitted through the second crevice 142, and a light L3 emitted through the third crevice 143 can be different from one another.

For example, when a light emitted from a light source connected to an optical fiber OF1 has a blue wavelength band, a material capable of absorbing a blue light and emitting a red light may be used as the CCM1 (first color conversion material), and a material that absorbs a blue light and emits a green light may be used as a CCM2 (a second color conversion material), or vice versa.

In the above aspect, the first crevice 141 is filled with the CCM1 (first color conversion material) that absorbs the blue light and emits the red light, and the third crevice 143 may be filled with a material that absorbs a blue light and emits a green light, respectively.

Accordingly, a light (L1, for example, the blue light) proceeding through a core portion 120 is emitted as the red light L2 through the first crevice 141, and is emitted as a blue light L1 through a second crevice 142, and is emitted as a green light L3 through the third crevice 143. That is, it is possible to diversify the wavelength band of the light emitted from each crevice according to the type of the CCM filled in each crevice.

In addition, the first crevice 141, the second crevice 142, and the third crevice 143 are arranged adjacent to each other so that the light L2 emitted through the first crevice 141 and the light L1 emitted through the second crevice 142, and the light L3 emitted through the third crevice 143 can be mixed with one another.

Accordingly, it is possible to provide an optical fiber that emits a light of a different wavelength band or a different color from the wavelength band of the light L1 proceeding through the core portion 120.

For example, when the light L1 proceeding through the core portion 120 is the blue light, as the red light L2 is emitted through the first crevice 141, the blue light L1 is emitted through the second crevice 142, and the green light L3 is emitted through the third crevice 143, and the first crevice 141, the second crevice 142, and the third crevice 143 are arranged adjacent to one another, so that the red light L2, the blue light L1, and the green light L3 may be mixed with one another to finally show a white light.

As described above, although the first crevice 141, the second crevice 142, and the third crevice 143 can be arranged to be overlap with one another at an outermost side of the cladding portion 130 for mixing the light emitted through the first crevice 141, the second crevice 142 and the third crevice 143 (see FIG. 5), it may be arranged so as not to overlap with one another (i.e., spaced apart) within a range in which a mixing of the light is possible.

Figure 6:
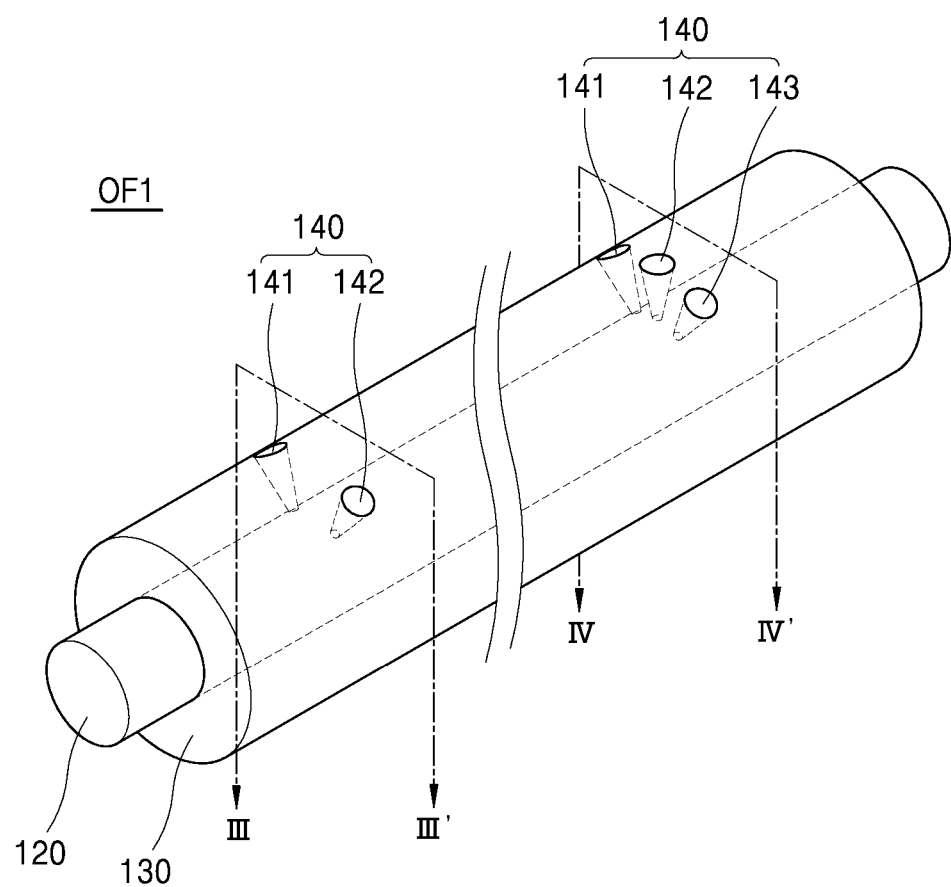
FIG. 6 is a perspective view of an optical fiber in accordance with another aspect of the present disclosure.

FIG. 6 is a perspective view of an optical fiber in accordance with another aspect of the present disclosure.

Referring to FIG. 6, in a case of the optical fiber OF1 in accordance with another aspect of the present disclosure, a first crevice 141 and a second crevice 142 in an opening 140 may be arranged along a direction intersecting with an extending direction of a core portion 120.

For reference, FIG. 6 is a perspective view showing a part of an area of an optical fiber OF1 in accordance with another aspect of the present disclosure. For convenience, the necessary number of the openings 140 is shown only for the explanation of the opening 140.

Figure 7:
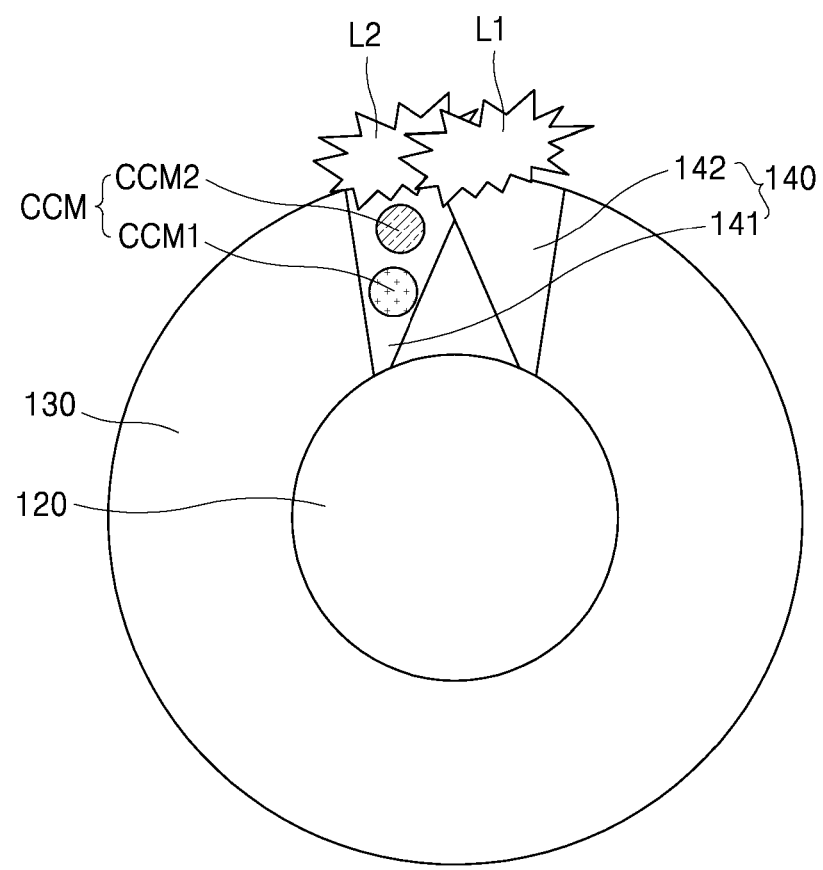
FIG. 7 is a cross-sectional view taken along line III-III' of FIG. 6.

FIG. 7 is a cross-sectional view taken along line III-III' of FIG. 6.

Referring to FIG. 7, a first crevice 141 and a second crevice 142 in an opening 140 are arranged in a direction intersecting an extending direction of the core portion 120, and may have a shape from an inside (a portion to which the core portion contacts) toward an outside (an outermost of a cladding) in order to improve a diffusion efficiency of a light.

In addition, the first crevice 141 and the second crevice 142 may have an inclined shape from the inside toward the outside of the cladding portion 130. Accordingly, the first crevice 141 and the second crevice 142 may be arranged so as to overlap with each other at an outermost side of the cladding portion 130. In another example, the first crevice 141 and the second crevice 142 may be arranged such that they do not overlap with each other (i.e., spaced apart) within a range in which a mixing of a light is possible.

Similar to the aspect shown in FIG. 4, the opening 140 includes the first crevice 141 in which a CCM (color conversion material) is filled and the second crevice 142 in which a CCM (color conversion material) is not filled.

At this time, the first crevice 141 may be simultaneously filled with a material CCM1 that absorbs a blue light and emits a red light, and a material CCM2 that absorbs a blue light and emits a green light.

Therefore, a light L1 (for example, a blue light) proceeding through the core portion 120 can be emitted as a yellow light L2 through the first crevice 141 and can be emitted as a blue light L1 through a second crevice 142.

In addition, the first crevice 141 and the second crevice 142 are arranged adjacent to each other so that a light L2 emitted through the first crevice 141 and a light L1 emitted through the second crevice 142 can be mixed with each other.

Accordingly, it is possible to provide an optical fiber that emits a light of a different wavelength band or a different color from a wavelength band of the light L1 proceeding through the core portion 120.

For example, when the light L1 proceeding through the core portion 120 is a blue light, as the yellow light L2 is emitted through the first crevice 141 and the blue light L1 is emitted through the second crevice 142, and the first crevice 141 and the second crevice 142 are arranged adjacent to each other so that the yellow light L2 and the blue light L1 are mixed with each other to finally show a white light.

Figure 8:
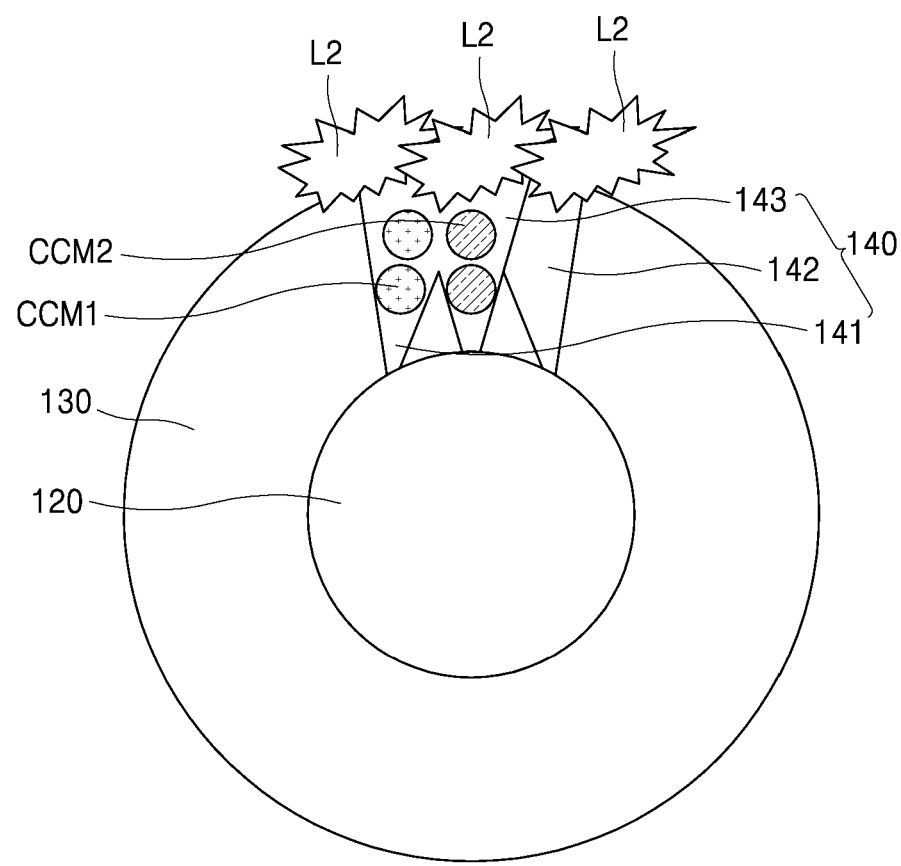
FIG. 8 is a cross-sectional view taken along line IV-IV' of FIG. 6.

FIG. 8 is a cross-sectional view taken along line IV-IV' of FIG. 6.

Referring to FIG. 8, a first crevice 141, a second crevice 142, and a third crevice 143 in an opening 140 are arranged in a direction intersecting an extending direction of a core portion 120, and it may have a shape extending from an inside thereof (a portion to which the core portion contacts) to an outside (an outermost side of a cladding) in order to improve a diffusion efficiency of a light.

In addition, the first crevice 141 and the second crevice 142 may have an inclined shape from the inside toward the outside of the cladding portion 130. That is, the third crevice 143 is formed at the shortest distance from the core portion 120 to the outermost side of the cladding portion 130, while the first crevice 141 and the second crevice 142 disposed on both sides of the third crevice 143, respectively can be arranged to be inclined toward the third crevice 143.

Accordingly, the first crevice 141, the second crevice 142, and the third crevice 143 may be arranged so as to overlap with one another at the outermost side of the cladding portion 130. In another example, the first crevice 141, the second crevice 142, and the third crevice 143 may be disposed such that they do not overlap with one another (i.e., spaced apart) within a range in which a mixing of a light is possible. In yet another example, any two crevices of the first crevice 141, the second crevice 142 and the third crevice 143 may be arranged to overlap with each other.

The opening 140 includes a first crevice 141 in which a CCM1 (first color conversion material) is filled, the second crevice 142 in which a CCM (color conversion material) is not filled, and the third crevice 143 in which a CCM2 (second color conversion material) is filled. According to the difference of a presence or absence of the CCM (color conversion material), the wavelengths of a light L2 emitted through the first crevice 141, a light emitted through the second crevice 142, and a light emitted through the third crevice 143 can be different from one another.

For example, when a light emitted from a light source connected to an optical fiber OF1 has a blue wavelength band, a material that absorbs a blue light and emits a red light may be used as the CCM1 (the first color conversion material), a material that absorbs a blue light and emits a green light may be used as the CCM2 (the second color conversion material), or vice versa.

In the above example, the first crevice 114 may be filled with the CCM1 (the first color conversion material) that absorbs the blue light and emits the red light, and the third crevice 143 may be filled with the material CCM2 that absorbs the blue light and emits the green light.

Therefore, a light L1 (for example, the blue light) proceeding through the core portion 120 can be emitted as a red light L2 through the first crevice 141, and can be emitted as a blue light L1 through the second crevice 142, and can be emitted as a green light L3 through the third crevice 143.

In addition, the first crevice 141, the second crevice 142 and the third crevice 143 are arranged adjacent to one another so that the light L2 emitted through the first crevice 141, the light L1 emitted through the second crevice 142, and the light L3 emitted through the third crevice 143 can be mixed with one another.

Accordingly, as a result, it is possible to provide an optical fiber that emits the light of a different wavelength band or a different color from the wavelength band of the light L1 proceeding through the core portion 120.

For example, when the light L1 proceeding through the core portion 120 is the blue light, as the red light L2 is emitted through the first crevice 141, the blue light L1 is emitted through the second crevice 142, the green light L3 is emitted through the third crevice 143, and the first crevice 141, the second crevice 142, and the third crevice 143 are arranged adjacent to one another so that the red light L2, the blue light L1, and the green light L3 may be mixed with one another to finally show a white light.

Figure 9:
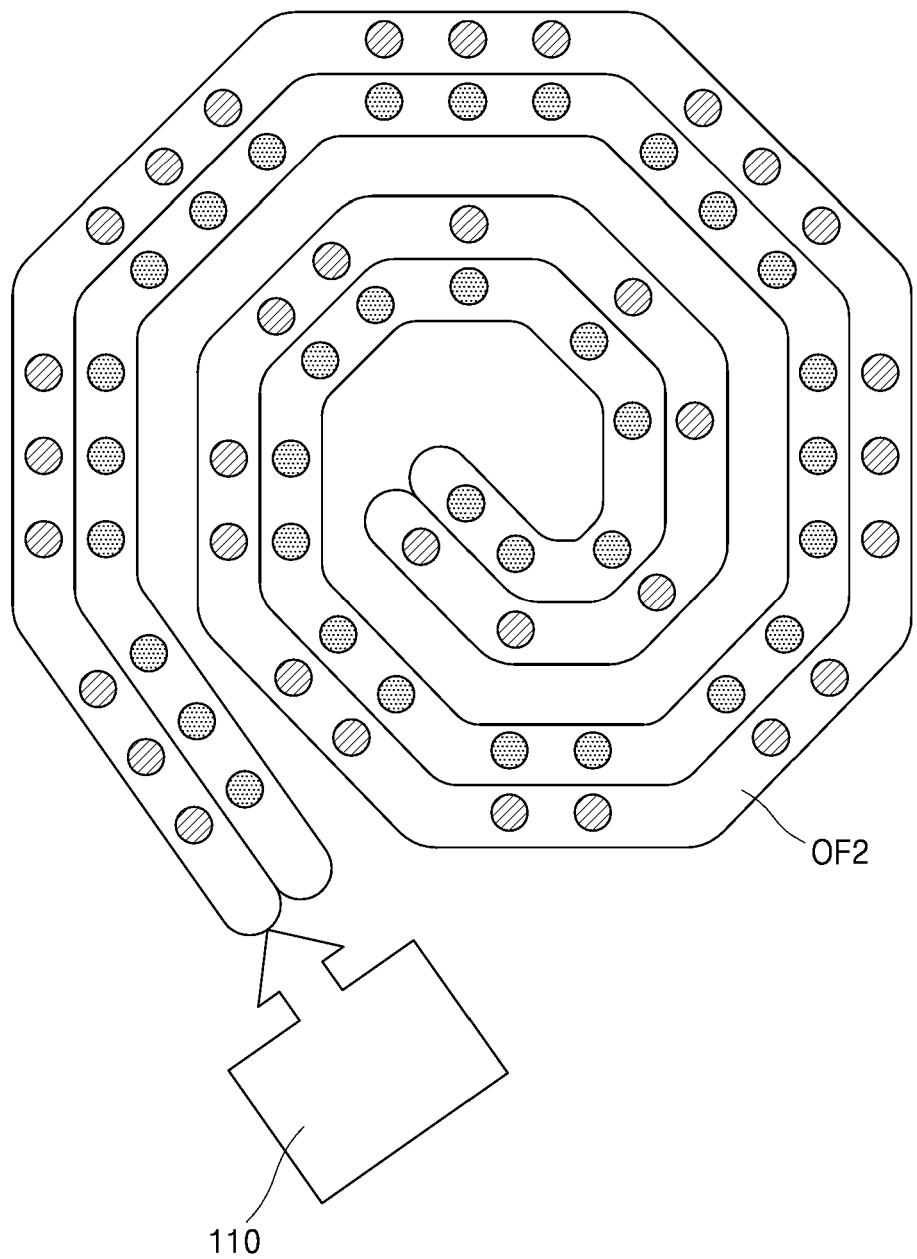
FIG. 9 schematically shows a configuration of a backlight unit in accordance with another aspect of the present disclosure.

FIG. 9 schematically shows a configuration of a backlight unit 200 in accordance with another aspect of the present disclosure.

Referring to FIG. 9, the backlight unit 200 in accordance with another aspect of the present disclosure includes a light source 210 that emits a light of a single wavelength, an optical fiber OF2 that converts a wavelength of a light emitted from the light source 210 and emits it.

Figure 10:
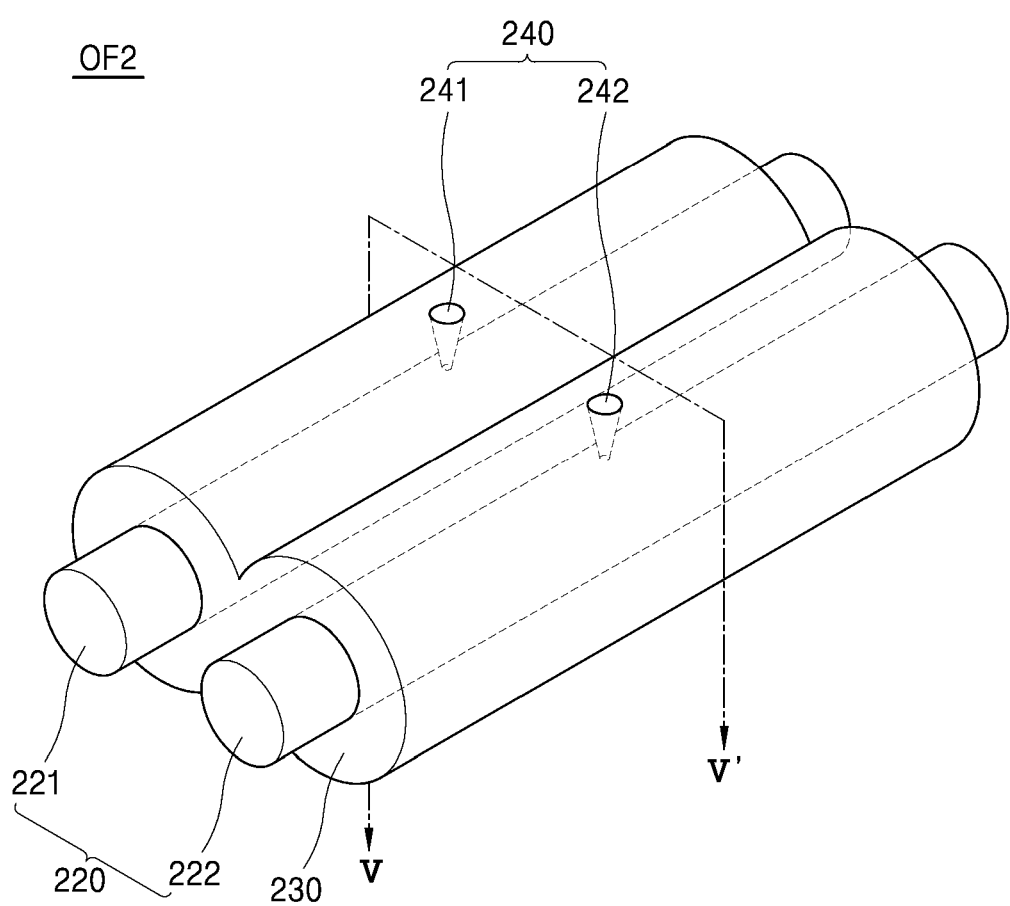
FIG. 10 is a perspective view of the optical fiber used in FIG. 9.

Referring to FIG. 10 showing a perspective view of an optical fiber used in FIG. 9, an optical fiber OF2 in accordance with an aspect of the present disclosure includes a first core 221 in which a CCM is filled and a second core 222 in which a CCM is not filled, and a cladding 230 that covers an outer peripheral surface of the core portion 220. In addition, the cladding 230 is arranged with a plurality of openings 240 along an extending direction of the core portion 220 or the first core 221 and the second core 222.

Here, the optical fiber OF2 is a form in which two cores 221, 222 are covered by one cladding 230, that is, a form provided with two cores 221, 222 to which the light emitted from the light source in one optical fiber OF2 is proceeded.

In addition, in another example, the optical fiber OF2 may be a form in which a first optical fiber including a first core 221 and a cladding 230 to cover the first core 221 and a second optical fiber including a second core 222 and a cladding to cover the second core 222 are attached to each other. At this time, a shape of the cladding 230 can be realized in a free shape as necessary.

That is, it is possible to provide different types of optical fibers depending on the number of cores included in one optical fiber, and a structure and a shape of the optical fiber can be modified according to a use of the optical fiber, etc.

For reference, FIG. 10 is a perspective view showing a part of an area of the optical fiber OF2 in accordance with another aspect of the present disclosure. For convenience, the necessary number of the opening 240 is shown only for the explanation of the opening 240.

Figure 11:
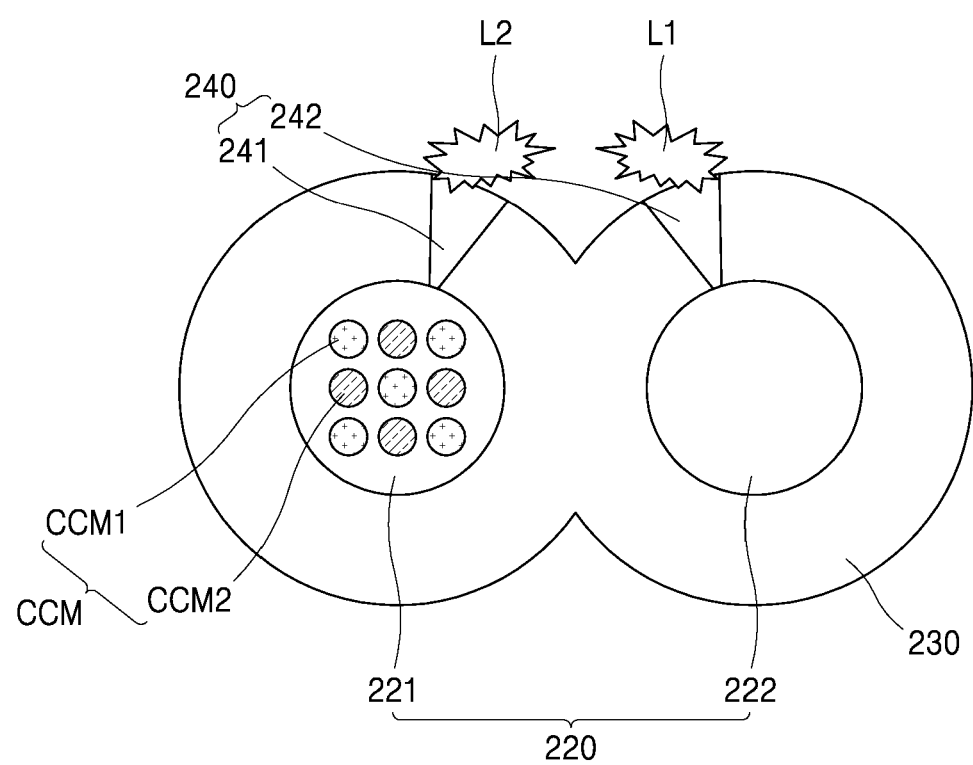
FIG. 11 is a cross-sectional view taken along line V-V' in FIG. 10.

FIG. 11 is a cross-sectional view taken along line V-V' in FIG. 10.

Referring to FIG. 11, an optical fiber is a form that a core portion 220 including two cores 221, 222 are covered by one cladding 230, the cladding 230 is arranged with an opening 240 that exposes the core portion 220. The opening 240 may have a shape extending from the inside (the portion to which the core portion contacts) toward the outside (the outermost side of the cladding) in order to improve a diffusion efficiency of a light.

The core 220 includes a first core 221 in which a CCM (a color conversion material) is filled and a second core 222 in which a CCM (a color conversion material) is not filled. The wavelength band of the light L2 emitted to the outside of the first core 221 can be different from that of the light L1 emitted to the outside of the second core 222 depending on the presence or the absence of the CCM (color conversion material).

In the above aspect, the first core 221 may be simultaneously filled with a material CCM1 that absorbs a blue light and emits a red light, and a material CCM2 that absorbs a blue light and emits a green light.

Therefore, the blue light L1 emitted to the first core 221 is converted to a yellow light L2 by the CCM (color conversion material) and is emitted to an outside, and the blue light L1 emitted to the second core 222, in which the CCM (the color conversion material) is not filled, can be emitted as the blue light L1 of an original wavelength band.

Here, the opening 240 includes a first crevice 241 to expose the first core 221 and a second crevice 242 to expose the second core 222. At this time, the first crevice 241 is disposed in an area of the cladding 230 adjacent to the first core 221, and the second crevice 242 is disposed in an area of the cladding 230 adjacent to the second core 222.

In addition, the first crevice 241 and the second crevice 242 expose the first core 221 and the second core 222 in a direction in which they are oriented to each other so that a light L2 emitted through the first crevice 241 and a light L1 emitted through the second crevice 242 can be mixed with each other.

Accordingly, as a result, it is possible to provide the optical fiber to emit a light of a different wavelength band or different color from the wavelength band of the light L1, L2 proceeding through two cores 221, 222.

For example, when the light L1 emitted from the light source to the core portion 220 is the blue light, as the yellow light L2 is emitted through the first crevice 241 and the blue light L1 is emitted through the second crevice 242, and the first crevice 241 and the second crevice 242 are arranged in a direction in which the first crevice 241 and the second crevice 242 are oriented to each other so that the yellow light L2 and the blue light L1 are mixed with each other to finally show a white light.

Figure 12:
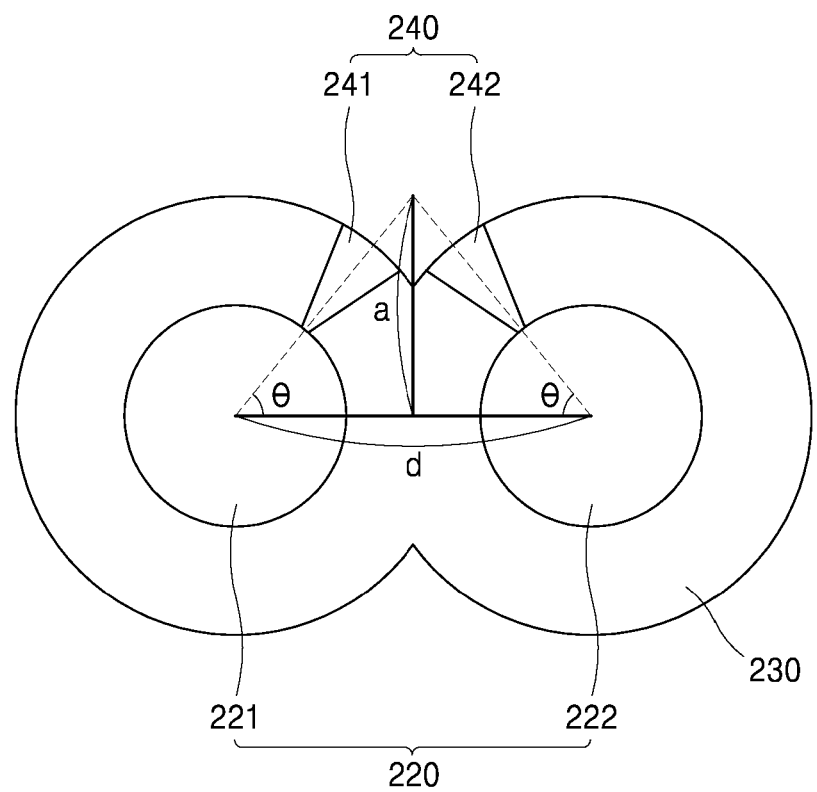
FIG. 12 is a cross-sectional view showing a variable that calculates an orientation angle of a first crevice and a second crevice.

As described above, the first crevice 241 and the second crevice 242 has to be arranged so as to be oriented to each other for a mixing of the light emitted through the first crevice 241 and the second crevice 242, and an orientation angle ($\theta$) of the first crevice 241 and the second crevice 242 can be determined with reference to FIG. 12 and Equation 1 below.

$$\text{Orientation angle}(\theta) = \arctan(2a/d) \pm 15° \quad \text{[Equation 1]}$$

Where a is the shortest distance from a center of a first core to an outermost side of a cladding or the shortest distance from a center of a second core to an outermost side of a cladding and d is the shortest distance between a center of a first core and a center of a second core Here, the orientation angle ($\theta$) is a scale that indicates how much the first crevice 241 is inclined from a vertical direction of the first core 221 toward the second core 222, or how much the second crevice 242 is inclined from a vertical direction of the second core 222 toward the first core 221 and the orientation angle ($\theta$) of the first crevice 241 or the second crevice 242 can have a margin of $\pm 15°$.

When the orientation angle ($\theta$) of the first crevice 241 or the second crevice 242 exceeds $+15°$ degrees from the calculated value of $\arctan(2a/d)$, it is excessively biased in the vertical direction of each core, and the mixing of the light emitted through the first crevice 241 and the second crevice 242 may be insufficient. On the other hand, when the orientation angle ($\theta$) of the first crevice 241 or the second crevice 242 exceeds $-15°$ from the calculated value of arctan (2a/d), there is a concern that it is excessively biased toward a relative core side, and an extraction efficiency of a light through the first crevice 241 and the second crevice 242 may be degraded.

Figure 13:
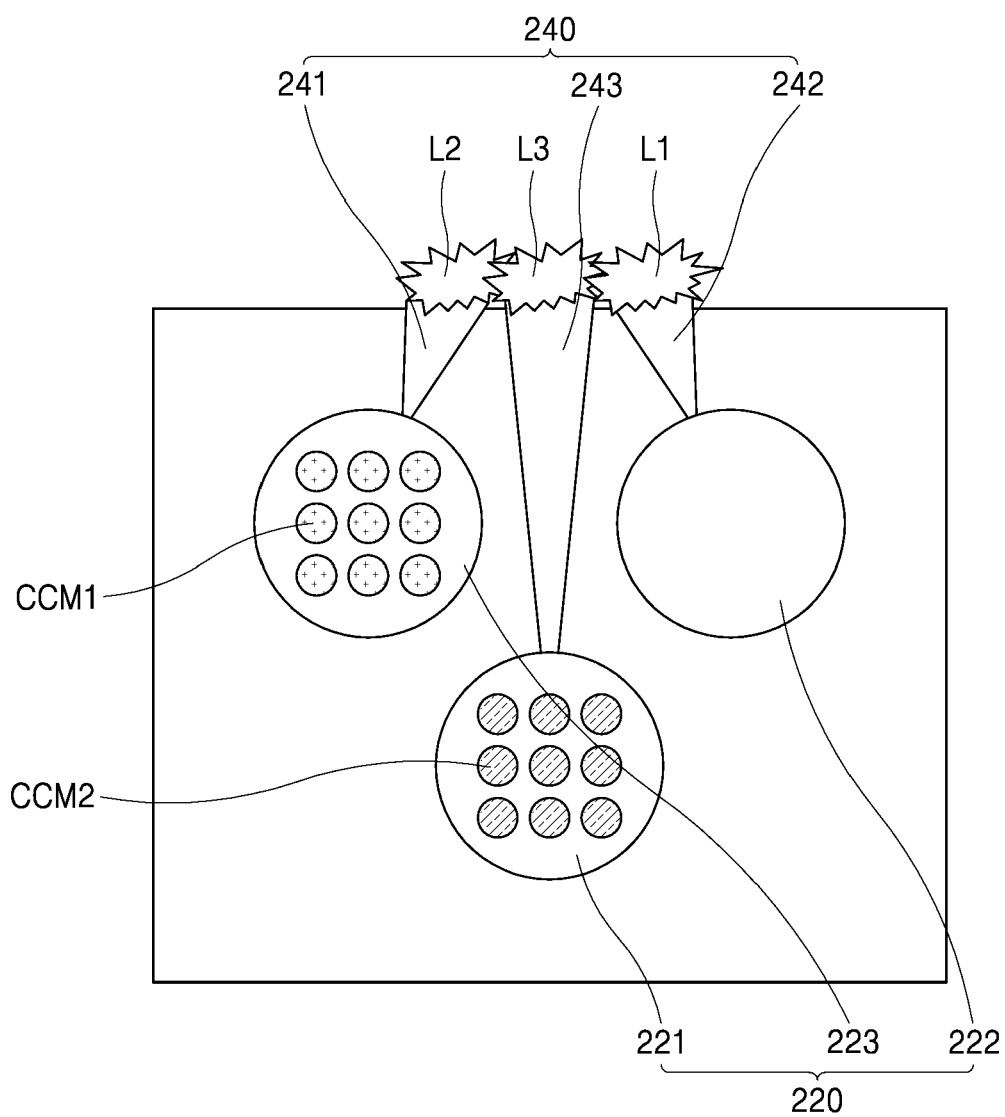
FIG. 13 is a cross-sectional view showing another example of the optical fiber used in FIG. 9.

FIG. 13 is a cross-sectional view showing another example of an optical fiber used in FIG. 9.

Referring to FIG. 13, a core portion 220 includes a first core 221 in which a CCM1 (a first color conversion material) is filled, a second core 222 in which a CCM (a color conversion material) is not filled, and a third core 223 in which a CCM2 (a second color conversion material) is filled. According to the difference of the presence or the absence of the CCM (color conversion material), the wavelengths of a light L2 emitted to an outside of the first core 221, a light L1 emitted to an outside of the second core 222, and an light L3 emitted to an outside of the third core 223 can be different from one another.

For example, when a light emitted from a light source connected to the optical fiber OF2 has a blue wavelength band, a material that absorbs a blue light and emits a red light may be used as the CCM1 (first color conversion material), and a material that absorbs a blue light and emits a green light may be used as the CCM2 (the second color conversion material), or vice versa.

In the above aspect, the first core 221 is filled with the material CCM1 to absorb the blue color and emit the red light and the third core 233 is filled with the material CCM2 to absorb the blue light and emit the green light, respectively.

Therefore, the blue light L1 emitted from the first core 221 is converted into the red light L2 by the CCM1 (the first color conversion material) and is emitted to the outside, and the blue light L1 emitted to the third core 223 can be converted to the green light L3 by the CCM2 (the second color conversion material) and emitted to the outside. That is, it is possible to diversify the wavelength band of the light emitted from each core depending on the type of the color conversion material filled in each core.

In addition, the first crevice 241, the second crevice 242 and the third crevice 243 expose the first core 221, the second core 222, and the third core 223 in a direction in which they are oriented to one another so that a light L2 emitted through the first crevice 241, a light L1 emitted through the second crevice 242, and a light L3 emitted through the third crevice 243 can be mixed with one another.

Accordingly, as a result, it is possible to provide an optical fiber to emit a light of a different wavelength band or different color from the wavelength band of the light L1, L2, and L3 proceeding through three cores 221, 222, and 223.

For example, when the light L1 emitted from the light source to the core portion 220 is the blue light, as the red light L2 is emitted through the first crevice 241, and the blue light L1 is emitted through the second crevice 242, and the green light L3 is emitted through the third crevice 243, and the first crevice 241, the second crevice 242 and the third crevice 243 are arranged in a direction in which they are oriented to one another, the red light L2, the blue light L1, and the green light L3 may be mixed with one another to finally show a white light.

As described above, according to the present disclosure, it is possible to obtain the light of the desired wavelength band or the desired color (for example, the white color) by connecting the optical fiber to which the CCM is applied to the single laser light emitting element to emit the light of the specific wavelength band, instead of connecting the plurality of laser light emitting elements to emits the light of a different wavelength band from each other to the optical fiber, or using the plurality of optical fibers connected to the plurality of laser light emitting elements to emit the light of the different wavelength band from each other in order to obtain the light of the desired wavelength band or the desired color (for example, the white color).

In addition, according to the present disclosure, there is no need to provide a separate optical film for changing the wavelength band of the light emitted through the optical fiber connected to the light source, so that the problem of the extraction efficiency of the light emitted from the optical fiber by the optical film being reduced can be resolved.

In addition, in the device using the optical fiber, such as the backlight unit, since it is possible to obtain the light of the desired wavelength band or the desired color (for example, the white light) without the separate optical film for changing the wavelength band of the light emitted from the light source, the device having the simpler configuration can be formed.

While the aspects of the present disclosure have been mainly described, various modifications and changes can be made at a level of those skilled in the art. It is therefore to be understood that such changes and modifications are included within the scope of the present disclosure unless these changes and modifications do not deviate the scope of the present disclosure.

What is claimed is:

1. An optical fiber, comprising:
   a core portion; and
   a cladding portion that covers an outer peripheral surface of the core portion;
   wherein the cladding portion has a plurality of openings extending from an inside toward an outside along an extending direction of the core portion,
   wherein the plurality of openings has a first crevice with which a color conversion material is filled and a second crevice with which a color conversion material is not filled,
   wherein the first crevice and the second crevice are adjacent to each other.

2. The optical fiber of claim 1, wherein the color conversion material absorbs a blue light and emits a red light or a green light.

3. The optical fiber of claim 1, wherein the first crevice is filled with a material that absorbs a blue light and emits a red light, and a material that absorbs a blue light and emits a green light.

4. The optical fiber of claim 1,
   wherein the opening further comprises a third crevice,
   wherein the first crevice is filled with a material that absorbs a blue light and emits a red light, and
   wherein the third crevice is filled with a material that absorbs a blue light and emits a green light.

5. The optical fiber of claim 1, wherein the first crevice and the second crevice are disposed in one opening and arranged along the extending direction of the core portion.

6. The optical fiber of claim 1, wherein the first crevice and the second crevice are disposed in one opening and arranged along a direction intersecting the extending direction of the core portion.

7. An optical fiber, comprising:
   a core portion comprising a first core with which a color conversion material is filled and a second core with which a color conversion is not filled; and
   a cladding portion that covers an outer peripheral surface of the core portion;
   wherein a plurality of openings extending from an inside toward an outside is arranged along an extending direction of the first core and the second core.

8. The optical fiber of claim 7, wherein the color conversion material absorbs a blue light and emits a red light or a green light.

9. The optical fiber of claim 7, wherein the plurality of openings includes a first crevice that exposes the first core and a second crevice that exposes the second core.

10. The optical fiber of claim 9, wherein the first crevice and the second crevice expose the first core and the second core in a direction respectively oriented to each other.

11. The optical fiber of claim 10, wherein the first crevice and the second crevice have an orientation angle (θ) determined by the following Equation 1:

$$\text{Orientation angle}(\theta) = \arctan(2a/d) \pm 15° \quad \text{[Equation 1]}$$

where a is a shortest distance from a center of a first core to an outermost side of a cladding or a shortest distance from a center of a second core to an outermost side of a cladding, and d is a shortest distance between a center of a first core and a center of a second core.

12. The optical fiber of claim 7, wherein the first core includes a material that absorbs a blue light and emits a red light, and a material that absorbs a blue light and emits a green light.

13. The optical fiber of claim 7,
wherein the core portion further comprises a third core portion,
wherein the plurality of openings further comprises a third crevice to exposes a third core,
wherein the first core portion is filled with a material that absorbs a blue light and emits a red light, and
wherein the third core portion is filled with a material that absorbs a blue light and emits a green light.

14. A backlight unit, comprising:
a light source that emits light having a single wavelength; and
an optical fiber that converts the single wavelength of the light emitted from the light source and emits the converted light;
wherein the optical fiber includes:
a core portion where the light emitted from the light source proceeds; and
a cladding portion that covers an outer peripheral surface of the core portion;
wherein the cladding portion is arranged with a plurality of openings extending from an inside toward an outside along an extending direction of the core portion,
wherein the plurality of openings includes a first crevice with which a color conversion material is filled and a second crevice with which a color conversion material is not filled, and
wherein the first crevice and the second crevice are adjacent to each other.

15. The backlight unit of claim 14, wherein the light source emits a blue light.

16. The backlight unit of claim 14, wherein the color conversion material is a material that absorbs a blue light and emits a red light or a green light.

17. The backlight unit of claim 14, wherein the first crevice includes a material that absorbs a blue light and emits a red light, and a material that absorbs a blue light and emits a green light.

18. A backlight unit, comprising:
a light source that emits light having a single wavelength; and
an optical fiber that converts the single wavelength of the light emitted from the light source and emits the converted light;
wherein the optical fiber includes:
a core portion that includes a color conversion material, and where the light emitted from the light source proceeds; and
a cladding portion that covers an outer peripheral surface of the core portion;
wherein the cladding portion is arranged with a plurality of openings extending from an inside toward an outside along an extending direction of the core portion.

19. The backlight unit of claim 18, wherein the light source emits a blue light.

20. The backlight unit of claim 18,
wherein the core portion includes a first core with which the color conversion material is filled and a second core with which the color conversion material is not filled, and
wherein the plurality of openings includes a first crevice that exposes the first core and a second crevice that exposes the second core.

21. The backlight unit of claim 18, wherein the first core is filled with a material that absorbs a blue light and emits a red light, and a material that absorbs a blue light and emits a green light.

* * * * *